United States Patent [19]
Patrick et al.

[11] Patent Number: 5,278,504
[45] Date of Patent: Jan. 11, 1994

[54] GRADIENT COIL WITH OFF CENTER SWEET SPOT FOR MAGNETIC RESONANCE IMAGING

[75] Inventors: John L. Patrick, Chagrin Falls; Michael A. Morich, Mentor; Labros Petropoulos, Cleveland Hts., all of Ohio; J. V. Hajnal, London; A. S. Hall, Middlesex, both of England

[73] Assignee: Picker International, Inc., Highland Hts., Ohio

[21] Appl. No.: 30,601

[22] Filed: Mar. 11, 1993

Related U.S. Application Data

[63] Continuation of Ser. No. 805,016, Dec. 11, 1991, abandoned, which is a continuation-in-part of Ser. No. 719,334, Jun. 21, 1991, Pat. No. 5,177,441, which is a continuation-in-part of Ser. No. 368,047, Jun. 16, 1989, Pat. No. 5,036,282.

[30] Foreign Application Priority Data

Dec. 12, 1990 [GB] United Kingdom ............... 9026924

[51] Int. Cl.$^5$ .............................................. G01V 3/00
[52] U.S. Cl. .................................... 324/318; 324/322
[58] Field of Search ............... 324/300, 307, 309, 313, 324/318, 319, 320, 322; 128/653.2, 653.5; 335/219

[56] References Cited

U.S. PATENT DOCUMENTS

| | | | |
|---|---|---|---|
| 3,577,067 | 5/1971 | Weaver | 324/320 |
| 4,486,711 | 12/1984 | Frese et al. | 324/319 |
| 4,689,591 | 8/1987 | McDougall | 335/299 |
| 4,720,679 | 1/1988 | Patrick et al. | 324/309 |
| 4,725,803 | 2/1988 | Prevot et al. | 335/299 |
| 4,847,985 | 7/1989 | Aubert | 29/605 |
| 4,978,919 | 12/1990 | Hinks | 324/313 |
| 5,012,192 | 4/1991 | Siebold | 324/318 |
| 5,036,282 | 7/1991 | Morich et al. | 324/318 |

FOREIGN PATENT DOCUMENTS

| | | |
|---|---|---|
| 0243270A1 | 4/1987 | European Pat. Off. |
| 0274149A1 | 11/1987 | European Pat. Off. |
| 0304126A1 | 8/1988 | European Pat. Off. |
| 0372096A1 | 11/1988 | European Pat. Off. |
| 0399789A2 | 5/1990 | European Pat. Off. |
| WO86/04687 | 8/1986 | PCT Int'l Appl. |

OTHER PUBLICATIONS

P. Mansfield and P. G. Morris, "NMR Imaging in Biomedicine", *Academic Press*, 1982.

*Primary Examiner*—Michael J. Tokar
*Attorney, Agent, or Firm*—Fay, Sharpe, Beall, Fagan, Minnich & McKee

[57] ABSTRACT

An examination region (12) is defined along a z-axis offset from a geometric center (30) of a gradient coil assembly (20). Cylinders of a non-conductive, non-magnetic material support x, y, and z-gradient coils (24, 26, 22) for causing orthogonal magnetic field gradients through the offset examination region. The z-gradient coil (FIG. 2) includes a plurality of distributed loop arrays with a winding pattern selected to cause a region of linear magnetic field gradients in the z-direction in a region offset toward a cylinder first end (32). The x and y-gradient coils each include two pairs of oppositely disposed windings (FIG. 3) which include a pair of inner spirals (96, 98) offset towards the first end of the cylinder and an outer spiral (90) extending therearound. The outer spiral bows in (92) toward the cylinder first end and fans out (94) toward the second end. In this manner, the x, y, and z-gradient coils create linear magnetic field gradients along x, y, and z-directions which have a region of primary linearity offset from their geometric center.

32 Claims, 6 Drawing Sheets

FIG. I

GRADIENT COIL WITH OFF CENTER SWEET SPOT FOR MAGNETIC RESONANCE IMAGING

This application is a continuation of U.S. application Ser. No. 07/805,016, filed Dec. 11, 1991, and now abandoned which is a continuation-in-part of U.S. application Ser. No. 07/719,334, filed Jun. 21, 1991, now U.S. Pat. No. 5,177,441, which in turn is a continuation-in-part of U.S. application Ser. No. 07/368,047, filed Jun. 16,1989, now U.S. Pat. No. 5,036,282.

BACKGROUND OF THE INVENTION

The present invention relates to the art of magnetic field gradient generation. It finds particular application in conjunction with establishing gradient magnetic fields in magnetic resonance imaging techniques and will be described with particular reference thereto. It is to be appreciated, however, that the invention will also find application in spectroscopy and other processes and apparatus in which accurate and predictable magnetic field gradients are established or maintained.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with preselected profiles. These radio frequency and gradient pulses excite magnetic resonance, phase and frequency encode the resonance, and cause phase and frequency encoded magnetic resonance signals to be emitted.

More specifically, the gradient magnetic pulses are applied to select and encode the magnetic resonance. In some embodiments, the magnetic field gradients are applied to select one or more planes or slices to be imaged. Gradient field pulses are also applied for selectively modifying the uniform magnetic field to encode frequency and phase into the magnetization, hence the resonance signals, in order to identify a spatial location.

The magnetic resonance signals are then processed to generate two or three dimensional image representations of a portion of the subject in the examination region. The accuracy of the resultant image representation is dependent upon the accuracy, among other factors, with which the actually applied magnetic field gradient pulses conform to selected gradient pulse profiles.

Linear magnetic field gradients are commonly produced by cylindrical gradient field coils. Discrete coils are wound in a bunched or distributed fashion on a large diameter hollow right cylinder tube, commonly 65 centimeters in diameter or larger. Conventional bunched geometries include Maxwell or modified-Maxwell pairs for z-gradient production and single or multi-arc Golay saddle coils for x and y gradient production. The coils are normally wound in a series arrangement and positioned to give a magnetic field profile with the desired linearity over a predefined volume. The distributive windings on the cylinders are generally wound and in pairs and driven anti-symmetrically. The coils are driven in an anti-symmetric manner such that only odd derivatives are non-zero at the coil origin. The first derivative is the field gradient while the third and higher order derivatives represent distortion. If the diameter of the cylinder and coil placement are chosen properly, the third derivative is canceled at the origin making the relatively weak fifth derivative component the first distortion term.

The conventional gradient coils are constructed of copper rods or multi-strand wires that are wound on a fiberglass reinforced plastic tube. The inductance, which is related to the stored magnetic energy, is critical in gradient coil design. The inductance determines to how quickly the coil can switch the gradient field on and off with a given supply of voltage. Larger inductances, as are typical in wound cylindrical coils, slow the switching speed of the gradient magnetic fields.

For maximum efficiency, it would be advantageous to reduce the diameter of the gradient coil cylinders to be as close as possible to the subject, provided gradient linearity can be maintained. The required energy for field gradient production varies roughly as a fifth power of a gradient coil cylinder diameter in free space. In an actual magnetic resonance imager, the gradient coils interact with other adjoining structures, such as radiation shields of superconducting magnets, making the relationship somewhat greater than the fifth power. Thus, reducing the coil size has a dramatic effect on power consumption.

Typically, the sweet spot or most linear, useable region at the coils is within the geometric center. A common way for improving the linearity or increasing the linear region in the axial direction is to lengthen the coil. Conversely, shortening the axial length of the coil tends to reduce the size of the linear region.

When imaging the head, particularly lower portions of the head and upper portions of the neck, the coils must be large enough to receive the patient's shoulders. When the coil is reduced in diameter to improve the switching speed and power consumption such that it just fits the head, the shoulders limit how far the patient's head can be inserted into the coil. Commonly, the linear portion or sweet spot of the coil can only be brought down to a central portion of the patient's head before the leading edge of the coil abuts the patient's shoulders. To move the imaging region down to the jaw or the top of the spine, for example, whole body size coils or surface coils are typically utilized. The whole body coils, being often twice the diameter or more of a head coil, suffers from slower switching times and higher power requirements.

U.S. Pat. No. 4,689,591, issued Aug. 25, 1987 to McDougall illustrates a whole body size coil in which the homogeneous region is offset from the geometric center of the coil.

The present invention provides a new and improved gradient coil configuration which facilitates shifting the linear volume of a coil axially, even on smaller diameter head coils.

SUMMARY OF THE INVENTION

In accordance With one aspect of the present invention, a gradient coil is provided which has its linear region offset from its axial center.

More specifically, three gradient coils are provided, each for generating linear magnetic field gradients along one of three mutually orthogonal axes. All three gradient coils defines its linear region along a common central axis asymmetrically from the center of the coil such that the linear region of all three coils are coincident.

In accordance with a more limited aspect of the present invention, the gradient coils include a first pair of identical coils positioned around the central axis of the imaging volume diametrically opposite to one another and a second pair of identical coils positioned around the imaging volume diametrically opposite to one another and overlapping the first pair of coils.

In accordance with another aspect of the present invention, each gradient coil pair for generating a gradient in a direction transverse to the central axis includes a double spiral.

In accordance with a more limited aspect of the present invention, each double spiral includes a larger ring of coils disposed symmetrically relative to the central axis, a smaller ring of coils axially offset from the first ring of coils, and a third ring of coils surrounding the first and second rings.

In accordance with another aspect of the present invention, an axial gradient coil is provided which generates magnetic field gradients along the central axis of the imaging volume displaced axially from a center thereof.

In accordance with a further aspect of the present invention, the axial gradient coil includes a first, denser group of coils adjacent one edge of the coil, a second, less dense group of windings adjacent the first, a third, more dense group of windings adjacent the second, and a fourth, less dense group of windings adjacent the third.

In accordance with a still more limited aspect of the present invention, the first and third coil winding groups include windings with opposite current flows.

In accordance with another aspect of the present invention, the coil sets are mounted on a generally elliptical cylinder sized to fit a patient's head, but too small to receive a patient's shoulders.

One advantage of the present invention is that it permits imaging of regions of the lower head and upper spinal cord.

Another advantage of the present invention is that it allows better patient access to an imaging region.

Another advantage of the present invention is that it does not require extended radial space. Radial return path gradients are not required.

Another advantage of the present invention is that it provides rapid switching of gradient fields.

Yet another advantage of the present invention is that it minimizes coil volume and improves coil efficiency.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
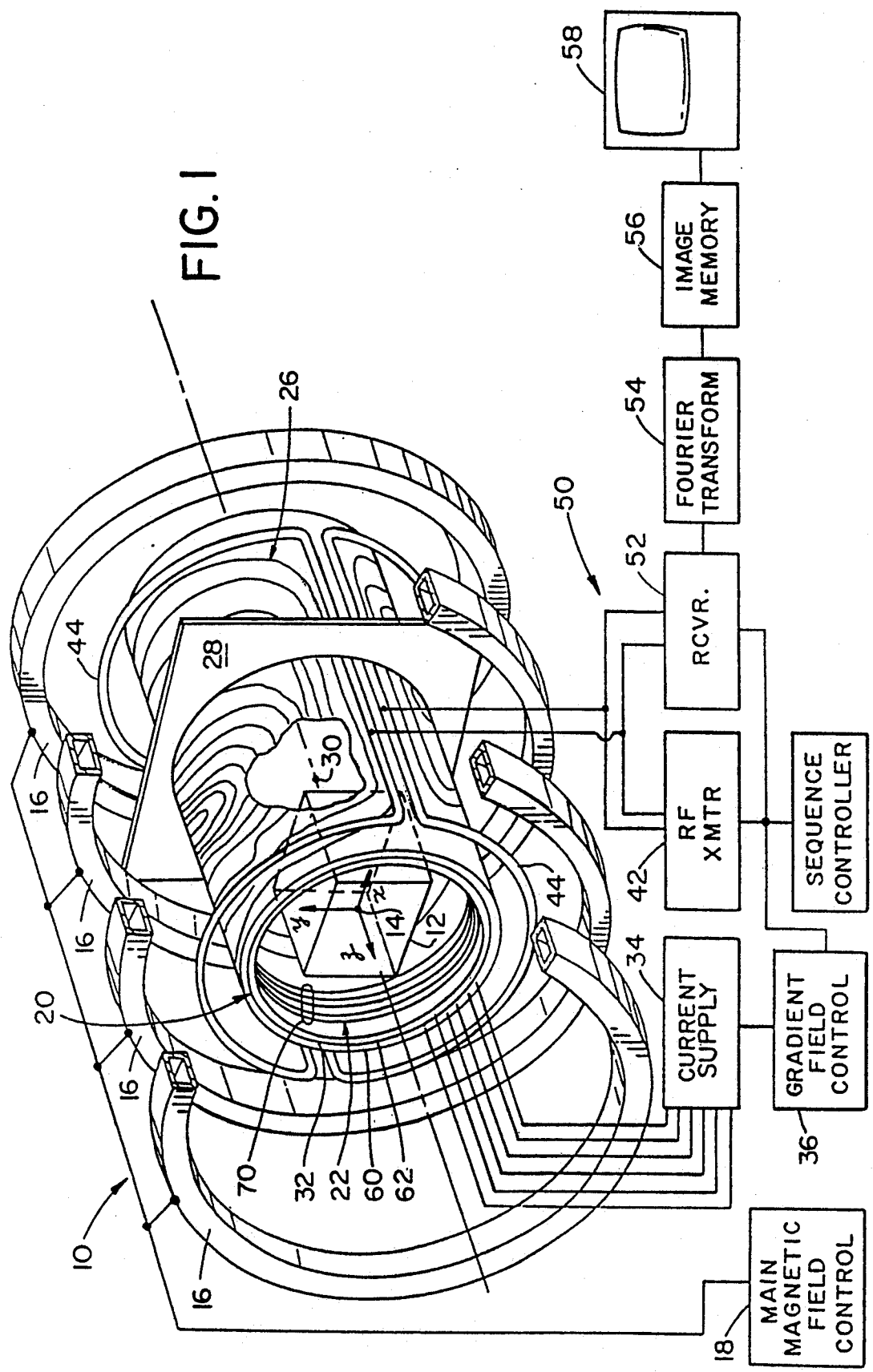
FIG. 1 is a diagrammatic illustration of a magnetic resonance imaging apparatus with a magnetic field gradient coil in accordance with the present invention.

With reference to FIG. 1, a main magnetic field means 10 generates a substantially uniform magnetic field longitudinally through an examination region 12 having a center 14. The main magnetic field means includes a plurality of main field magnets 16 which are operated under control of a magnetic field control means and power supply 18. preferably, the main magnetic field is a strong, uniform field that is aligned with a z or longitudinal axis. However, permanent and iron core magnets, e.g. a C-shaped magnet, with the uniform field along other than the z axis are also contemplated.

A gradient magnetic field means 20 selectively creates gradient magnetic fields across the examination region 12 which is not Centrally located along the z or longitudinal axis with respect to the gradient coil. The gradient field means includes a z-gradient coil assembly 22 which applies or creates magnetic field gradients along the z-axis. An x-gradient coil assembly 24 selectively applies or creates magnetic field gradients in an x direction transverse to the z-axis. A y-gradient coil assembly 26 selectively applies or causes magnetic field gradients in a y direction, transverse to the x and z axes. Each of the x, y, and z gradient coils has a geometric center. In the preferred embodiment, the coils have a common central plane 28 through this common geometric center point 30 on the z axis. Each of the x, y, and z-gradient coil assemblies has a linear gradient field region or sweet spot in which the magnetic fields which it generates are linear. These linear regions are coincident with each other and the examination region 12 but are not coincident with the geometric center. The examination region is offset along the z or longitudinal axis toward a first end 32 of the gradient coils from the common geometric center.

A current supply means 34 selectively supplies electrical current to each loop of the x, y, and z-gradient coils. The current is supplied to the current loops such that the current flows through some of the loops of each coil assembly in a first or clockwise direction and through other loops of the same assembly in an opposite or counterclockwise direction. A gradient field control means 36 controls the current supply means 34 to cause it to apply appropriate current pulses to the gradient field windings to cause selected gradient pulses.

A resonance excitation means includes a radio frequency transmitter 42 for generating radio frequency pulses of the appropriate frequency spectrum for inducing resonance in selected dipoles disposed in the examination region. The radio frequency transmitter is connected to a radio frequency antenna 44 disposed adjacent the examination region for transmitting radio frequency pulses into a region of interest of the patient or other subject in the examination region. Although the radio frequency antenna is illustrated as being disposed peripherally around the gradient coil assemblies, it is to be appreciated that such antenna may also be disposed within the gradient coil assemblies. For example, a surface coil may be positioned contiguous to an examined patient or subject for controllably inducing magnetic resonance in a selected contiguous region of the patient.

A magnetic resonance receiving means 50 includes the radio frequency coil 44 which receives, as well as transmits, radio frequency signals in the illustrated embodiment. For other studies, separate transmit and receive coils are used. For example, receive only surface coils may be disposed contiguous to a selected region of the patient to receive resonance signals induced by the radio frequency coil 44. A radio frequency receiver 52 receives the radio frequency signals from the antenna 44. The received radio frequency signals are demodulated and reconstructed into an image representation. More specifically, a Fourier transform means 54 performs an inverse two-dimensional fast Fourier transform on the magnetic resonance signals to transform them into an image representation for storage in an image memory means 56. As is conventional in the art, the image may represent a planar slice through the patient, an array of parallel planar slices, a three dimensional volume, or the like. A display means 58, such as a video monitor, provides a man-readable display of the resultant image. Other conventional processing equipment, which is conventional in the art, is omitted from the illustration for simplicity.

The gradient magnetic field means 20, in the preferred embodiment, includes two cylindrical formers 60, 62 made of a non-magnetic and non-conducting material. The two formers or sleeves are configured such that one is telescopically received or nests snugly within the other. Preferably, the x-gradient coil 24 is formed on one of the formers and the y-gradient coil 26 on the other. This enables the formers to be mechanically rotated to adjust the orthogonality of the x and y axes. The z-gradient coil 22 is preferably formed on the opposite surface of one of the formers from the x or y-gradient coil.

Figure 2:
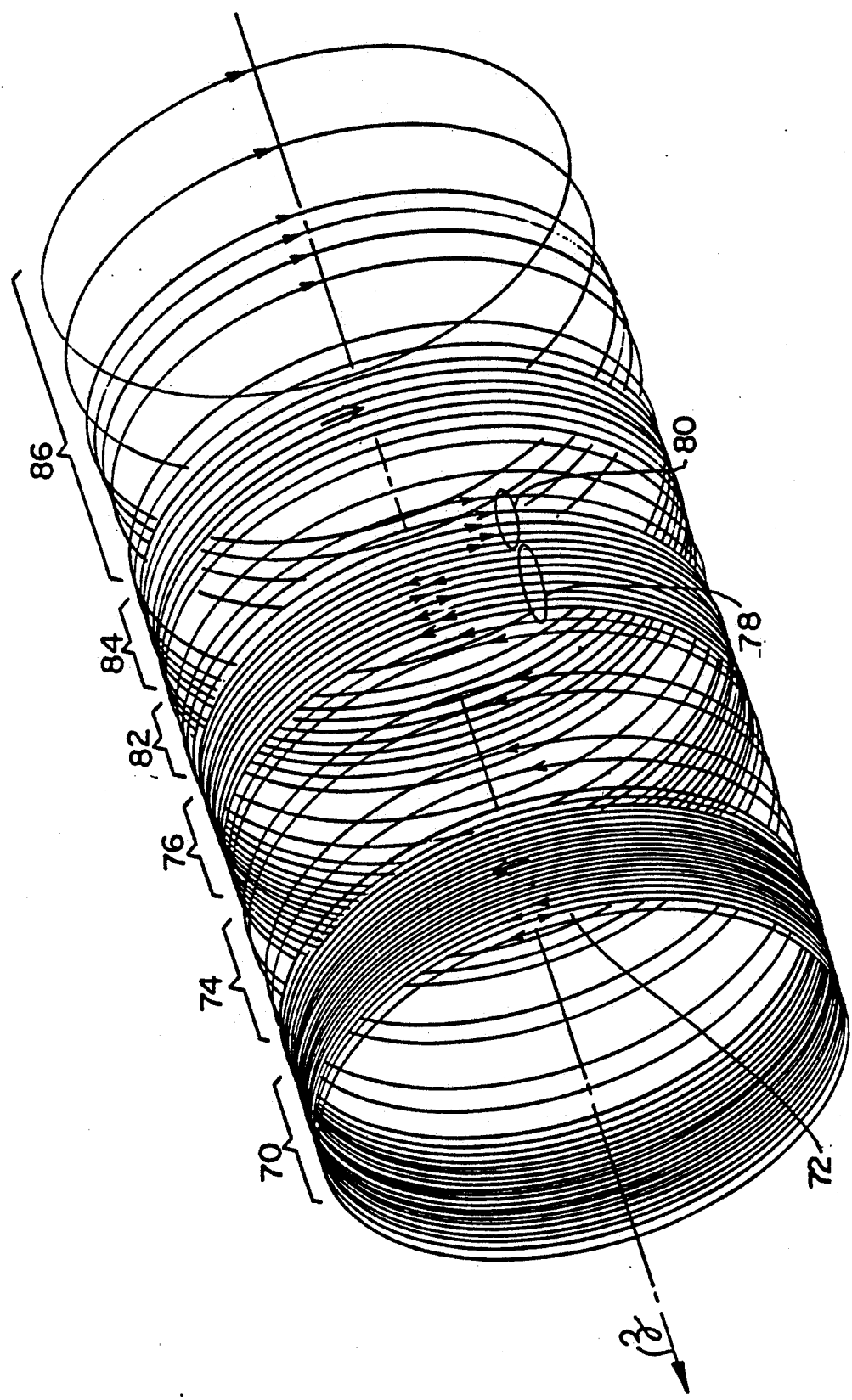
FIG. 2 illustrates a preferred z-gradient coil assembly winding pattern in accordance with the present invention.

With reference to FIG. 2, the z-gradient coil 22 includes a plurality of distributed windings encircling the z-axis. The distributed windings include a first loop array 70 adjacent the first end 32. The first loop array is a relatively dense winding assembly in which most of the windings convey current in a first (counterclockwise in the illustrated embodiment) direction. However, at least one of the windings 72 disposed closely adjacent an edge of the z-gradient coil conducts current in an opposite direction. A second group of windings 74 is disposed adjacent an interior edge of the first loop array. The second loop array is relatively sparse compared to the first loop array. A third loop array 76 is disposed adjacent an interior edge of the second loop array. The third loop array is divided between loops 78 carrying current in the first and loops 80 carrying current in a second, opposite direction (clockwise in the illustrated embodiment).

A fourth, relatively sparse loop array region 82 and a fifth loop array region 84 are disposed adjacent the third loop array. Currents in the fourth loop array region and the fifth loop array are directed in the second, clockwise direction. A sixth loop array 86 is disposed adjacent the fifth loop array at an opposite end of the z-gradient coil. Currents through the sixth loop array are primarily in the second direction.

In the illustrated embodiment, the current control means 34 supplies current in the above noted direction and with the same magnitude in each loop. Of course, like current flux densities can also be achieved by adjusting the current in more uniformly distributed loops.

In this manner, the z-gradient coil generates magnetic field gradients which are linear centered in the examination region disposed asymmetrically along the z-axis relative to a geometric center 30' of the z-gradient coil.

Figure 3:
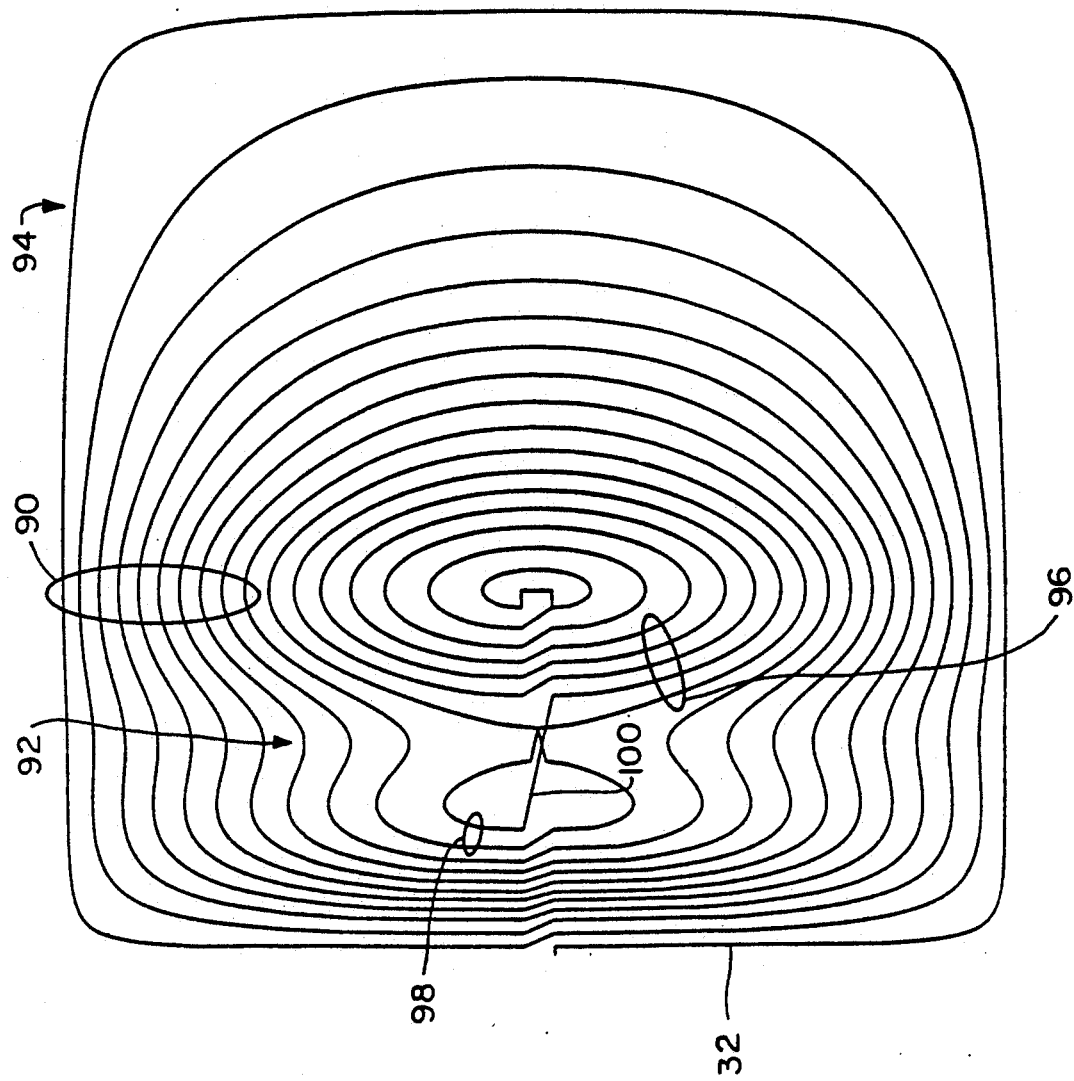
FIG. 3 illustrates a planar projection of one side of an x or y-gradient coil assembly winding pattern in accordance with the present invention.

With reference to FIG. 3, the x and y-gradient coils each include two windings disposed symmetrically on opposite sides of a plane along the z-axis. Each winding of the x and y-gradient coil includes a first, peripheral array of loops 90 through which current flows in a first (counterclockwise in the illustrated embodiment) direction. The first loop array bellies-in 92 adjacent the first end 32, i.e. adjacent the examination region, and fans out 94 away from the examination region 12. Each loop array further defines a second or major interior loop 96 in which currents flow in the first direction and a third loop array 98 in which the currents also flow in the first or counterclockwise direction. The two interior loop arrays 96, 98 are disposed generally symmetrically about a central axis of the coil with the major interior loop array disposed offset toward the first end 32 and the minor interior loop array 98 disposed between the major loop and the first end of the gradient coil.

In the preferred embodiment, each gradient coil winding is defined by covering about a half of the exterior surface of one of the formers with copper foil and etching or otherwise removing strips of copper such that the winding pattern of FIG. 3 remains. The illustrated winding pattern is ideal due to its minimal number of overlapping regions. The overlapping strip 100 extending from the minor loop is, preferably, formed from a separate piece of copper foil separated from the underlying layers by a thin insulator.

The current supply means 34 applies a like current through each winding of FIGS. 2 and 3 in the preferred embodiment. Optionally, substantially the same current density can be achieved by changing the number of conductors and making a corresponding adjustment in the current through each conductor.

Figure 4:
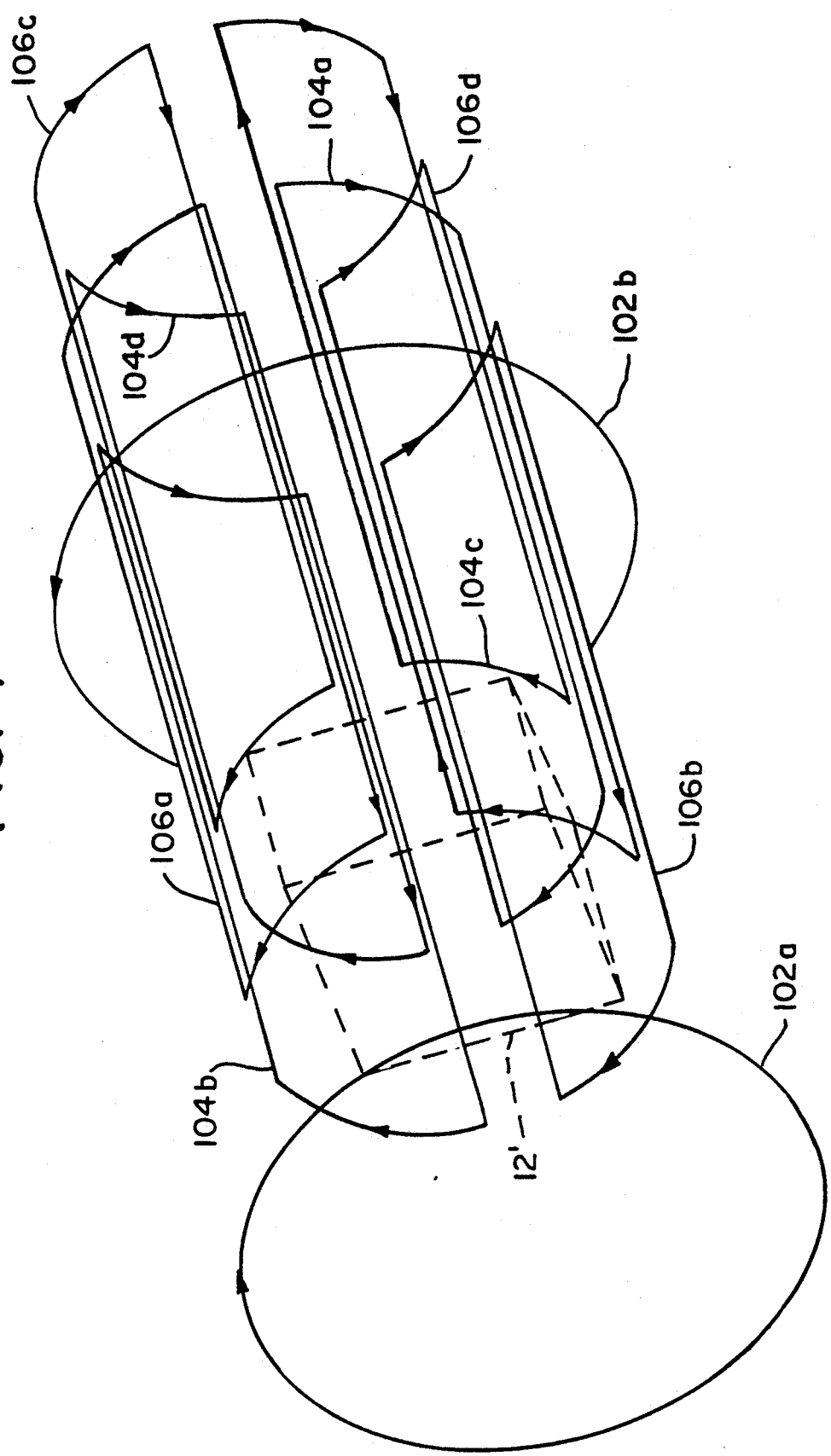
FIG. 4 illustrates an alternate embodiment of the gradient coil assembly pattern in perspective.

In the embodiment of FIG. 4, a pair of z-gradient circular, Maxwell coils 102a, 102b selectively generate linear gradients along the z-axis in the imaging region 12'.

Gradients in the x-direction are generated by four x-gradient saddle coils 104a, 104b, 104c, 104d. Saddle coils 104a and 104b are folded back over the other pair of saddle coils 104c and 104d. With this arrangement, the imaging region 12, of satisfactory gradient linearity is positioned towards one end of the coils 104. Analogously, linear gradients in the y-direction are generated with four y-gradient saddle coils 106a, 106b, 106c, 106d. One set of the saddle coils 106a, 106b is folded over the other pair of saddle coils 106c, 106d. This arrangement again places the region of satisfactory gradient linearity toward the one end of the coils. The position of the center of the region of satisfactory gradient linearity 12' in the axial direction is central between the Maxwell coils 102a, 102b which are positioned at a distance apart equal to about $3^{\frac{1}{2}}$ times the radius of the gradient coils. Thus, the center of the examination region 12' is about 0.866 times the radius from the nearer end of the coil arrays 104, 106, as compared with about 1.3 times the radius in a more conventional arrangement.

In FIG. 4, coils 104 and 106 are shown for clarity as not overlapping in the circumferential direction. In practice, the coils typically do so, preferably subtending an angle of about 120°.

Current flows in one direction through coils 104a, 104c and in an opposite direction through coils 104b, 104d. Preferably, current flows in one direction through coils 106a, 106c and in an opposite direction through coils 106b, 106d.

It will be seen from FIG. 4, that the four coils 104 now effectively comprise a single pair of coils 104a, 104c, and 104b, 104d correspondingly positioned at opposite sides of the imaging volume 12'. The conductors of each coils 104a, 104c and 104b, 104d are spaced axially at each end, more particularly in two groups. It will be appreciated in this connection that the spacing of the conductors at the right-hand end of the coils in FIG. 4 controls gradient linearity at the imaging region 12'. It also arises from the desirability of making all the coils 104 identical.

With the particular arrangement shown in FIG. 4, it is found that an improvement in gradient linearity can be effected by arranging the coils 104c, 104d to produce a larger number of ampere turns than coils 104a, 104b. In one particular arrangement of coils of an internal radius of 32 cm. and arranged carry identical currents, the coils 104a and 104b each have 15 turns and the coils 104c and 104d each have 12 turns.

It will be seen from FIG. 4, that the four coils 106 now effectively comprise a single pair of coils 106a, 106c, and 106b, 106d correspondingly positioned at opposite sides of the imaging volume 12, The conductors of each coils 106a, 106c and 106b, 106d are spaced axially at each end, more particularly in two groups. It will be appreciated in this connection that the spacing of the conductors at the right-hand end of the coils in FIG. 4 controls gradient linearity at the imaging region 12, It also arises from the desirability of making all the coils 106 identical.

With the particular arrangement shown in FIG. 4, it is found that an improvement in gradient linearity can be effected by arranging the coils 106c, 106d to produce a larger number of ampere turns than coils 106a, 106b. In one particular arrangement of coils of an internal radius of 32 cm. and arranged carry identical currents, the coils 106 a and 106b each have 15 turns and the coils 106c and 106d each have 12 turns.

One difficulty that arises with this coil is that the magnetic field produced when it is energized reacts with the static magnetic field to produce a net torque such as to tend to rotate the coils and hence the former on which the coil set is mounted. This is due to the non-symmetrical form of the coil set, and consequently this difficulty does not arise with symmetrical prior art coil sets, where the forces produced cancel one another out.

Figure 5:
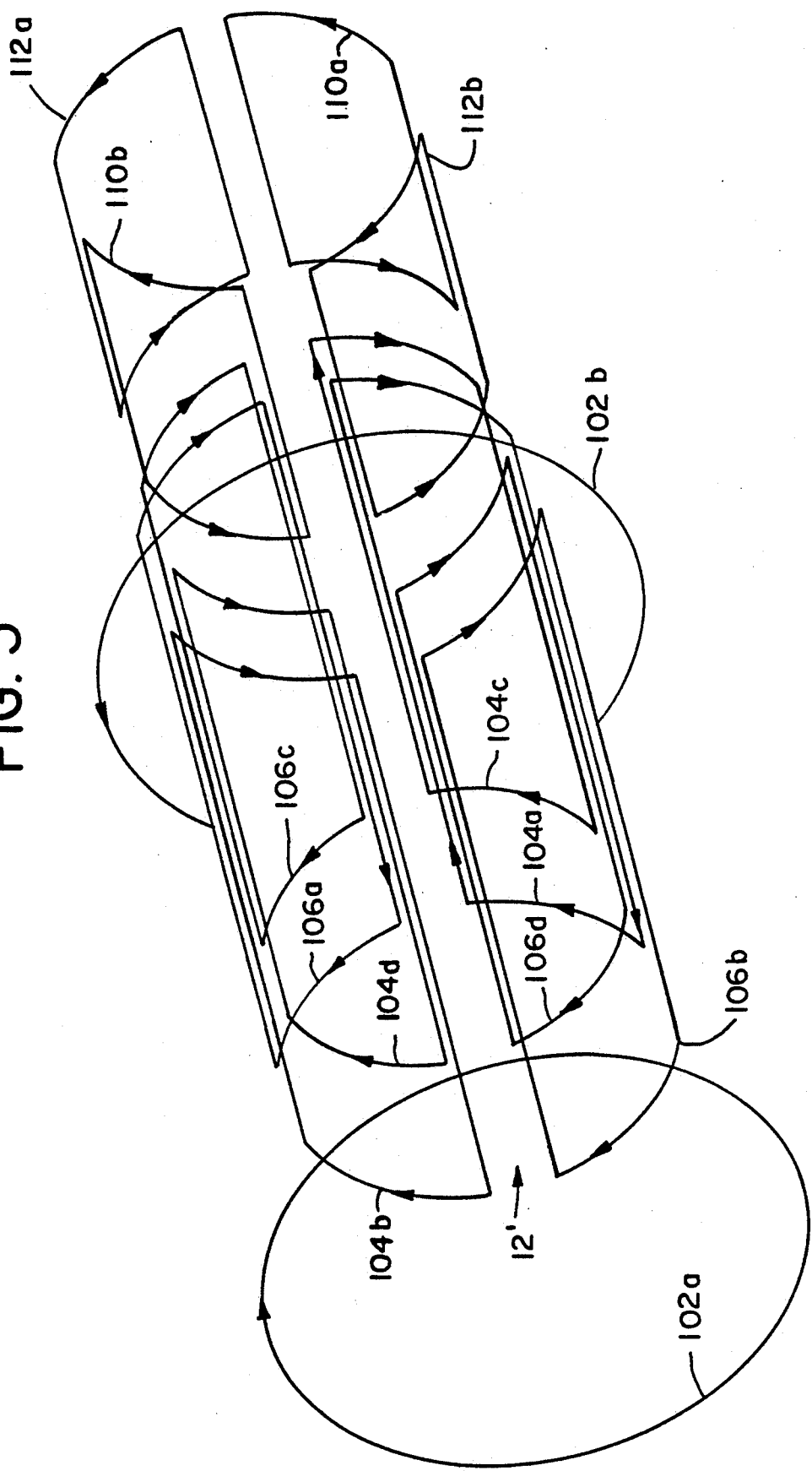
FIG. 5 is a diagram of a coil arrangement according to the invention incorporating a "bucking" coil arrangement.

In order to overcome this problem, so-called bucking coils are used. As shown in FIG. 5, these coils 110, 112 are positioned beyond the ends of the coils 104, 106 remote from the volume 12, and are arranged so as to produce, when energized, forces equal and opposite to those produced by the coils 104, 106 and thereby counteract such forces. To this end, one of a pair of identical diametrically oppositely positioned coils 110a, 110b, 112a, 112b are suitably used for each gradient coil set 104, 106. Each pair of bucking coils 110a, 110b, 112a, 112b, is axially aligned with the coils of the corresponding gradient coil set 104, 106 and mounted on the former therewith. Optionally, the bucking coils may be mounted on other structures connected to other portions of the former and mounted inside of the main magnetic field.

The bucking coils 110, 112 are conveniently connected for energization in series with the gradient coils 104, 106. However, they may be energized separately if desired, for example, to avoid increase of the inductance presented to the gradient coil energizing currents due to the bucking coils 110, 112 and thereby avoid increase of gradient current pulse rise and fall times due to the bucking coils 110, 112.

The coils are preferably wound with a conductor of rectangular cross-section with the turns lying alongside of one another in a direction parallel to the axis of the cylindrical volume which they surround. It will be appreciated that while referring to the embodiment of FIG. 4, the cylindrical volume is of circular cross-section, this is not necessary. In other embodiments of the invention, the volume may have other cross-sections, particularly an elliptical cross-section.

Figure 6:
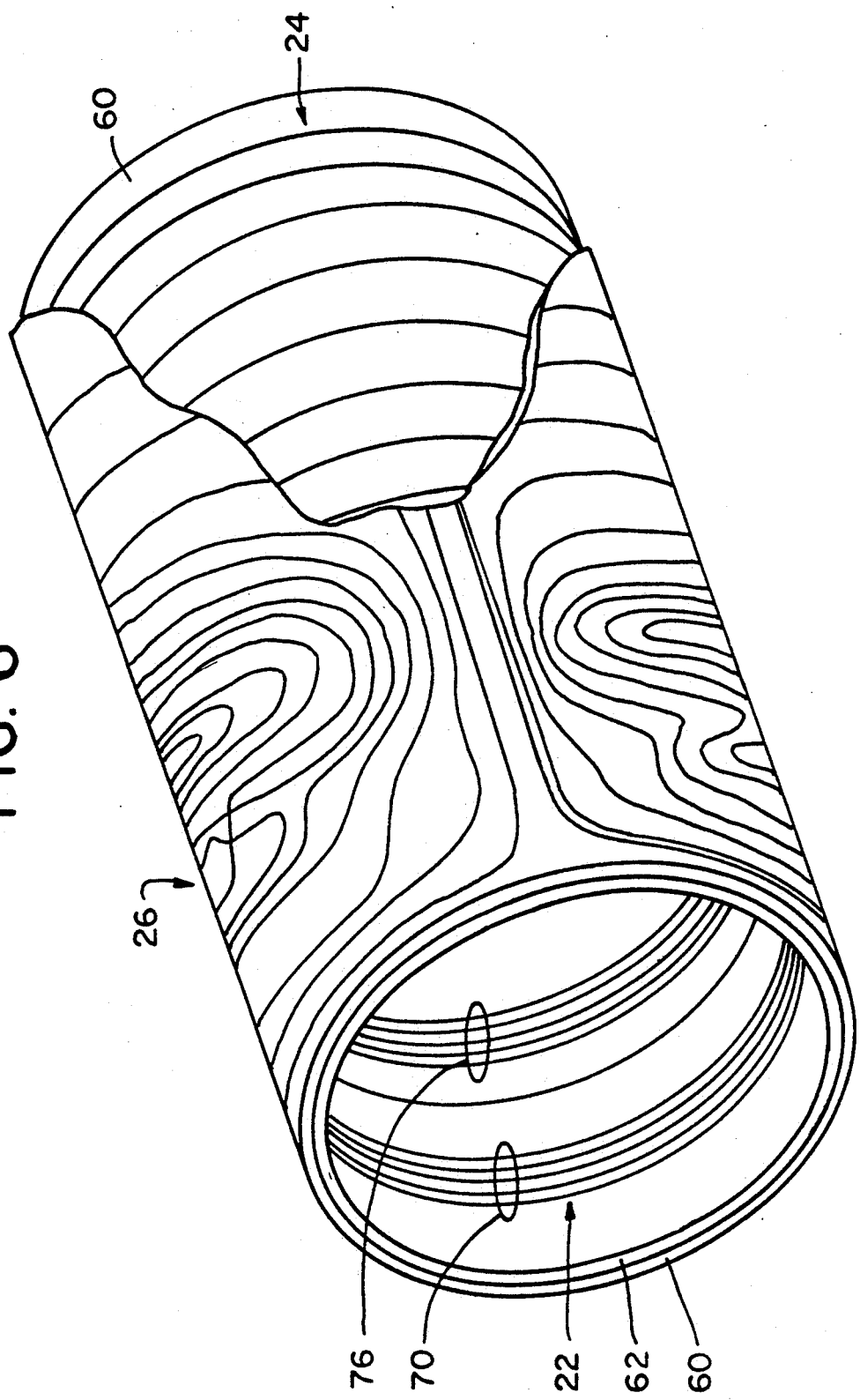
FIG. 6 illustrates another alternate embodiment of the gradient coil assembly in which the coil assembly is generally elliptical.

With reference to FIG. 6, the formers 60, 62 are shaped with an ellipse or ovoid cross sectional shape which better matches the cross-section of the patient's head or other body region that is to be imaged. The x-gradient coil windings become elongated in the y-direction, but are otherwise unchanged. Analogously, the y-coils become compressed in the x-direction, if the minor axis of the ellipse is smaller than the radius of the circle.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
 a main magnetic field means for generating a main magnetic field through an examination region;
 a magnetic resonance excitation means for selectively exciting magnetic resonance in dipoles disposed in the examination region;
 a magnetic field gradient means for generating magnetic field gradients across the examination region, the gradient magnetic field means including:
 an x-gradient coil disposed generally along a cylindrical surface extending circumferentially around a central axis for generating linear magnetic field gradients across the examination region in a first direction transverse to the central axis,
 a y-gradient coil disposed generally along a cylindrical surface extending circumferentially around the central axis for generating linear magnetic field gradients across the examination region in a second direction transverse to the central axis,
 a z-gradient coil disposed generally along a cylindrical surface extending circumferentially around a central axis for generating linear magnetic field gradients across the examination region in a third direction generally parallel to the central axis,
 the x, y, and z-gradient coils each having a geometric center midway between end windings thereof along the central axis, the examination region being displaced along the central axis from at least the x- and y-gradient coil geometric centers;
 a magnetic resonance signal receiving means for receiving magnetic resonance signals from the resonating dipoles; and, a processing means for processing the magnetic resonance signals.

2. The apparatus as set forth in claim 1 wherein the z-gradient coil geometric center is displaced along the central axis from the examination region.

3. The apparatus as set forth in claim 2 wherein the z gradient coil includes:
a first loop array disposed adjacent a first end of the z-gradient coil closest to the examination region;
a second loop array disposed adjacent the first loop array;
a third loop array disposed adjacent the second loop array;
a fourth loop array region disposed adjacent the third loop array;
a fifth loop array disposed adjacent the fourth loop array region; and,
a coil current supply means for supplying currents through the first, second, third, and fifth loop arrays such that (a) the first loop array has a current density primarily in a first circumferential direction, (b) the second loop array has a net current flux in the first circumferential direction, the second loop array having a smaller net current flux density than the first loop array, (c) the third loop array has current fluxes in the first circumferential direction and in a second circumferential direction opposite to the first,.and (d) the fifth loop array has a net current flux in the second circumferential direction.

4. The apparatus as set forth in claim 3 wherein the z-gradient coil further includes a sixth loop array disposed adjacent the fifth loop array, the coil current supply means supplying a net current flux through the sixth loop array in the second direction.

5. The apparatus as set forth in claim 4 wherein the first, third, and fifth loop arrays have a higher current flux density than the second and sixth current loop arrays.

6. The apparatus as set forth in claim 3 wherein the coil current supply means further supplies current through a fraction of windings of the first loop array in the second circumferential direction.

7. The apparatus as set forth in claim wherein at least one of the x and y-gradient coils includes a mirror image pair of distributed windings on opposite sides of the cylindrical surface, each distributed winding including:
a first circumferential loop array extending peripherally therearound;
a second loop array disposed within the peripheral first loop array;
a third loop array disposed within the peripheral first array between the second loop array and a first end.

8. The apparatus as set forth in claim 7 wherein the first loop array bellies-in adjacent the third loop array and fans-out adjacent a second end of the coil.

9. The apparatus as set forth in claim 7 wherein the z magnetic field gradient includes:
a first loop array disposed adjacent a first end of the z-gradient coil closest to the examination region, the first loop array having a net current flow in a first direction;
a second loop array disposed adjacent the first loop array;
a third loop array disposed adjacent the second loop array;
a fourth loop array region disposed adjacent the third loop array;
a fifth loop array disposed adjacent the fourth loop array region; and
a current supply means for supplying currents through the first, second, third, and fifth loop arrays such that the first loop array has a current density primarily in a first circumferential direction, the second loop array has a smaller net current flux than the first loop array in the first circumferential direction, the third loop array has current fluxes in the first circumferential direction and in a second circumferential direction opposite to the first, and the fifth loop array has a net current flux in the second circumferential direction.

10. The apparatus as set forth in claim 1 wherein:
the x-gradient coil includes a cylindrical non-magnetic, non-conductive former on which a pair of distributed windings are oppositely disposed; and the y-gradient coil includes a cylindrical non-magnetic, non-conductive former on which a pair of oppositely disposed distributed windings are mounted, the x and y-gradient coils being telescopically received and oriented substantially 90° offset from each other.

11. The apparatus as set forth in claim 10 wherein the first and second cylindrical formers are generally elliptical in cross-section.

12. The apparatus as set forth in claim 1 wherein at least one of the x and y-gradient coils include a pair of coils positioned around the imaging region diametrically opposite to one another, each of the coils having its conductors axially spaced at one axial end of the coil.

13. The apparatus as set forth in claim 12 wherein at least one of the x and y-gradient coils includes a second pair of coils disposed diametrically opposite from one another and axially overlapping said first pair of coils.

14. The apparatus as set forth in claim 12 wherein the coils of the first pair of coils have more turns than the coils of the second pair of coils.

15. The apparatus as set forth in claim 13 wherein the coils are saddle coils of generally rectangular shape.

16. The apparatus as set forth in claim 1 wherein the x and y-gradient coils tend to exert a rotational torque relative to the central axis and further including:
a coil means for exerting a rotational torque with is substantially equal and opposite to the x and y-gradient coils rotational torque.

17. The apparatus is set forth in claim 16 wherein the equal and opposite rotational torque coil means includes an array of coils disposed adjacent an end of the x and y-gradient coils most remote from the examination region.

18. A gradient coil for a magnetic resonance apparatus, the gradient coil comprising:
a first pair of saddle coils positioned around an imaging volume diametrically opposite one another, the first coil pair having its conductors axially spaced at one axial end of the gradient coil;
a second pair of saddle coils positioned around the imaging volume diametrically opposite one another and overlapping said first pair of saddle coils axially.

19. The apparatus as set forth in claim 18 wherein the saddle coils tend to exert a torque and further including:
a coil means for exerting a torque which is substantially equal and opposite to the saddle coil torque.

20. A gradient coil for a magnetic resonance apparatus, the gradient coil comprising:
a non-magnetic, non-conductive cylindrical former;
a first loop array extending circumferentially around the former adjacent a first end thereof;
a second loop array disposed adjacent the first loop array;
a third loop array disposed adjacent the second loop array;
a fourth loop array region disposed adjacent the third loop array;
a fifth loop array, the first, third, and fifth loop arrays having denser winding pattern than the second loop array and the fourth loop array region.

21. The gradient coil assembly as set forth in claim 20 further including a current supply for supplying current to the loop arrays such that the first and second loop arrays have a primary current flow in a first circumferential direction, said fifth loop array has a primary current flow in a second circumferential direction opposite the first, and the third loop array has current flows in both the first and the second circumferential directions.

22. The apparatus as set forth in claim 20 further including a current supply means for supplying current to the loop arrays, the current supply means supplying current to the first loop array such that a majority of current flows in a first circumferential direction and a minority of current flows closely adjacent the former first end in a second circumferential direction opposite to the first circumferential direction.

23. A gradient coil for a magnetic resonance apparatus, the gradient coil comprising:
a non-magnetic, non-conductive cylindrical former;
a pair of windings disposed opposite each other across the cylindrical former, each of the windings having a first, outer spiral winding which bows in adjacent a first end of the cylindrical former and fans out adjacent a second end of the cylindrical former, a second spiral winding and a third spiral winding, the second and third spiral windings being disposed adjacent to each other and within the first spiral winding, the second and third spiral windings being offset towards the first end of the former.

24. A magnetic resonance method comprising:
passing a main magnetic field through an examination region;
positioning a gradient coil assembly asymmetrically relative to the examination region;
exciting dipoles in the examination region to magnetic resonance;
passing currents along a first pair of double spiral paths defined by the gradient coil assembly with an asymmetric current density which is denser adjacent the examination region to generate gradient magnetic fields along a first direction through the examination region;
passing currents along a second pair of double spiral paths defined by the gradient coil assembly which are offset relative to the first pair with an asymmetric current density which is denser adjacent the examination region to generate gradient magnetic fields along a second direction through the examination region;
passing currents along a multiplicity of circumferential currents paths defined by the gradient coil assembly with an asymmetric current density which is denser adjacent the examination region to generate gradient magnetic fields along a third direction through the examination region.

25. A coil set in a magnetic resonance apparatus for imposing on a magnetic field in a cylindrical volume in which an object to be examined is placed in use of the apparatus a gradient in a direction transverse to the axis of the volume, the coil set effectively comprising a pair of coils correspondingly positioned around said volume diametrically opposite one another, each of said coils having an axial end portion in which the conductors of the coil are spaced apart axially, and which is substantially radially aligned with said volume.

26. The coil set according to claim 25 wherein said conductors in said axial end portion of each coil are positioned in two groups spaced apart axially and include a first pair of identical coils positioned around said volume diametrically opposite one another and a second pair of identical coils positioned around said volume diametrically opposite one another and overlapping said first pair of coils axially.

27. The coil set according to claim 26 wherein each said coil is a saddle coil of rectangular shape.

28. The coil set according to claim 26 in combination with a second coil set for imposing a gradient on said magnetic field in the direction of the axis of said volume comprising a Maxwell coil pair disposed coaxially with said volume in axially spaced relationship so as to lie one on either side of said axial end portions.

29. The coil set according to claim 25 in combination with a bucking coil arrangement which when energized produces forces which counteract forces arising from energization of said coil set.

30. A magnetic resonance apparatus comprising:
a main magnetic field means for generating a static magnetic field through an examination region;
a magnetic resonance excitation means for selectively exciting magnetic resonance in dipoles disposed in the examination region;
a magnetic field gradient means for generating magnetic field gradients across the examination region, the gradient magnetic field means including a z-gradient coil including:
a means for providing a distribution of winding currents flowing generally peripherally around a z-axis, the winding currents being asymmetric with respect to a geometric center of the z-gradient coil, such that the examination region is displaced along a central axis of the z-gradient coil from the geometric center of the z-gradient coil;
a magnetic resonance signal receiving means for receiving magnetic resonance signals from the resonating dipoles; and,
a processing means for processing the magnetic resonance signals.

31. A z-gradient coil for generating magnetic field gradients along a z-axis through an examination region of a magnetic resonance apparatus, the z-gradient coil comprising:
a non-magnetic, non-conductive cylindrical former mountable parallel to the z-axis;
an electrically conductive winding means extending around the former for carrying a distribution of winding currents which are not mirror image symmetric about a center thereof such that the examination region is displaced along the z-axis from said geometric center.

32. A magnetic resonance apparatus comprising:

a static magnetic field means for generating a static magnetic field through an examination region;

a magnetic resonance excitation means for selectively exciting magnetic resonance in dipoles disposed in the examination region;

x, y, and z-gradient coils which have windings surrounding a central axis through the examination region, the windings extending between opposite end windings and defining a geometric center midway between said end windings, the examination region being displaced along the central axis form the geometric center;

a magnetic resonance signal receiving means for receiving magnetic resonance signals from the resonating dipoles; and a processing means for processing the magnetic resonance signals.

* * * * *